United States Patent
Chen

(10) Patent No.: US 8,710,630 B2
(45) Date of Patent: Apr. 29, 2014

(54) MECHANISMS FOR MARKING THE ORIENTATION OF A SAWED DIE

(75) Inventor: Hsien-Wei Chen, Sinying (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/180,208

(22) Filed: Jul. 11, 2011

(65) Prior Publication Data

US 2013/0015561 A1   Jan. 17, 2013

(51) Int. Cl.
*H01L 29/06* (2006.01)

(52) U.S. Cl.
USPC ...... 257/618; 257/737; 257/E23.01; 438/106; 438/107; 438/123

(58) Field of Classification Search
USPC ....... 257/737, 618, 48, E23.01; 438/106–123
See application file for complete search history.

(56) References Cited

U.S. PATENT DOCUMENTS

| | | | | |
|---|---|---|---|---|
| 4,888,085 A * | 12/1989 | Smith | ............ | 438/35 |
| 5,153,507 A * | 10/1992 | Fong et al. | ............ | 324/762.05 |
| 5,739,800 A * | 4/1998 | Lebby et al. | ............ | 345/82 |
| 6,492,716 B1 * | 12/2002 | Bothra et al. | ............ | 257/678 |
| 6,841,455 B2 * | 1/2005 | West et al. | ............ | 438/462 |
| 6,861,754 B2 * | 3/2005 | Lin et al. | ............ | 257/758 |
| 6,861,764 B2 | 3/2005 | Sato et al. | | |
| 6,869,829 B2 | 3/2005 | Hikita et al. | | |
| 6,876,062 B2 * | 4/2005 | Lee et al. | ............ | 257/622 |
| 7,052,968 B1 * | 5/2006 | Lee et al. | ............ | 438/401 |
| 7,256,475 B2 * | 8/2007 | Jao et al. | ............ | 257/622 |
| 7,265,436 B2 * | 9/2007 | Huang et al. | ............ | 257/620 |
| 7,566,915 B2 * | 7/2009 | Chang et al. | ............ | 257/127 |
| 7,795,704 B2 * | 9/2010 | Wu | ............ | 257/620 |
| 7,906,836 B2 * | 3/2011 | Chen et al. | ............ | 257/675 |
| 8,058,151 B2 * | 11/2011 | Jeng et al. | ............ | 438/460 |
| 8,125,054 B2 * | 2/2012 | West et al. | ............ | 257/620 |
| 8,217,394 B2 * | 7/2012 | Yang et al. | ............ | 257/48 |
| 8,217,499 B2 | 7/2012 | Yu et al. | | |
| 8,334,582 B2 * | 12/2012 | Jeng et al. | ............ | 257/620 |
| 8,395,239 B2 * | 3/2013 | Chen et al. | ............ | 257/619 |
| 2004/0002198 A1 * | 1/2004 | Lee et al. | ............ | 438/460 |
| 2004/0084777 A1 * | 5/2004 | Yamanoue et al. | ............ | 257/758 |
| 2004/0150070 A1 * | 8/2004 | Okada et al. | ............ | 257/508 |
| 2004/0150073 A1 * | 8/2004 | Matumoto et al. | ............ | 257/630 |
| 2005/0026397 A1 * | 2/2005 | Daubenspeck et al. | ............ | 438/465 |
| 2005/0263855 A1 * | 12/2005 | Fu et al. | ............ | 257/620 |
| 2006/0001165 A1 * | 1/2006 | Tokitoh et al. | ............ | 257/758 |
| 2006/0012012 A1 * | 1/2006 | Wang et al. | ............ | 257/620 |
| 2006/0055007 A1 * | 3/2006 | Yao et al. | ............ | 257/660 |
| 2006/0103025 A1 * | 5/2006 | Furusawa et al. | ............ | 257/758 |
| 2006/0109014 A1 * | 5/2006 | Chao et al. | ............ | 324/754 |
| 2006/0214798 A1 * | 9/2006 | Wang | ............ | 340/572.7 |
| 2007/0023915 A1 * | 2/2007 | Jao et al. | ............ | 257/758 |
| 2007/0023920 A1 * | 2/2007 | Jao et al. | ............ | 257/778 |
| 2007/0052106 A1 | 3/2007 | Watase et al. | | |
| 2007/0102791 A1 * | 5/2007 | Wu | ............ | 257/618 |
| 2007/0158788 A1 * | 7/2007 | Yang | ............ | 257/620 |
| 2007/0187845 A1 * | 8/2007 | Fu et al. | ............ | 257/797 |
| 2008/0191205 A1 * | 8/2008 | Tsai et al. | ............ | 257/48 |

(Continued)

*Primary Examiner* — Alexander Sofocleous
*Assistant Examiner* — Ankush Singal
(74) *Attorney, Agent, or Firm* — Lowe Hauptman & Ham, LLP

(57) ABSTRACT

Mechanisms for identifying orientation of a sawed die are provided. By making metal pattern in the corner stress relief region in one corner of the die different from the other corners, users can easily identify the orientation of the die.

21 Claims, 6 Drawing Sheets

(56) References Cited

U.S. PATENT DOCUMENTS

| | | | |
|---|---|---|---|
| 2008/0211093 A1* | 9/2008 | Ke et al. | 257/738 |
| 2008/0290340 A1* | 11/2008 | West | 257/48 |
| 2009/0001522 A1* | 1/2009 | Wu | 257/622 |
| 2009/0115024 A1* | 5/2009 | Jeng et al. | 257/620 |
| 2010/0078769 A1* | 4/2010 | West et al. | 257/620 |
| 2010/0123219 A1* | 5/2010 | Chen et al. | 257/620 |
| 2010/0197114 A1* | 8/2010 | Jeng et al. | 438/460 |
| 2011/0080189 A1* | 4/2011 | Gluschenkov et al. | 324/762.02 |
| 2011/0115057 A1* | 5/2011 | Harn et al. | 257/620 |
| 2011/0193198 A1* | 8/2011 | Chen | 257/619 |
| 2011/0205477 A1* | 8/2011 | Akai et al. | 349/138 |
| 2012/0104594 A1* | 5/2012 | Chen et al. | 257/737 |

* cited by examiner

US 8,710,630 B2

MECHANISMS FOR MARKING THE ORIENTATION OF A SAWED DIE

FIELD

The present disclosure relates generally to mechanisms for marking semiconductor die orientation.

BACKGROUND

Modern integrated circuits are typically made of literally millions of active devices, such as transistors and capacitors. These devices are initially isolated from each other, but are later interconnected together to form functional circuits. Typical interconnect structures include lateral interconnections, such as metal lines (wirings), and vertical interconnections, such as vias and contacts. Interconnections are increasingly determining the limits of performance and the density of modern integrated circuits. On top of the interconnect structures, bond pads are formed and exposed on the surface of the respective chip. Electrical connections are made through bond pads to connect the chip to a package substrate or another die. Bond pads could be used for wire bonding or flip-chip bonding.

Flip-chip packaging utilizes bumps to establish electrical contact between a chip's input/output (I/O) pads and the substrate or lead frame of the package. Structurally, a bump actually contains the bump itself and an under bump metallurgy (UBM) layer located between the bump and an input/output (I/O) pad.

The orientation of a flip-chip package is often specified by markings on the package surface. The markings are placed on the package surface at the end of the packaging process. Determining the chip (or die) orientation prior to placing the markings is a challenge.

DETAILED DESCRIPTION

Figure 1A:
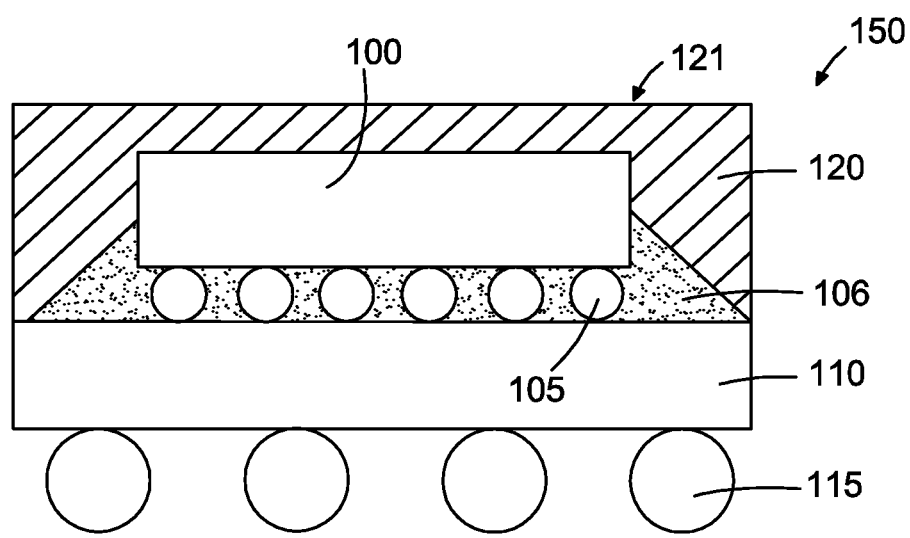
FIG. 1A shows a schematic diagram of flip-chip package with an integrated circuit (IC) chip on a package substrate, in accordance with some embodiments.

The present disclosure relates generally to forming a semiconductor device on a substrate. It is understood, however, that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature on a second feature in the description that follows may include embodiments in which the first and second features are formed in direct contact, and may also include embodiments in which additional features may be formed interposing the first and second features, such that the first and second features may not be in direct contact. As an example, a feature formed on a substrate may include features formed on, above, and/or within the substrate.

As mentioned above, flip-chip packaging utilizes bumps to establish electrical contact between a chip's I/O pads and the substrate or lead frame of the package. FIG. 1A shows a schematic diagram of flip-chip package 150 with an integrated circuit (IC) chip 100 on a package substrate 110, in accordance with some embodiments. IC chip 100 is packaged with flip-chip packaging by forming bumps 105 on the frontside of the IC chip 100. Bumps 105 electrically and possibly physically contact the I/O pads of the IC chip 100. The IC chip 100 with the bumps 105 is flipped over to be placed on a package substrate 110, which could be connected to ball grid array (BGA) balls 115. The embodiment shown in FIG. 1A is merely an example. IC chip 100 with bumps 105 could be applied on other types of substrates, such as an application board, and a substrate with embedded passive and/or active devices.

The space between and around the IC chip 100, the bumps 105 and the substrate 110 could be filled with an under-fill material 106. A plastic capping mold 120 is formed on the backside of IC chip 100 to protect IC chip 100. Marking(s) (not shown) may be formed on surface 121 of the plastic capping mold 120 to identify the product and orientation. Product information, such as company name, product type, etc., may be included in the marking(s). The orientation of IC chip 100 may be identified by the orientation of the markings. The markings are normally placed on surface 121 at the end of the packaging process.

Figure 1B:
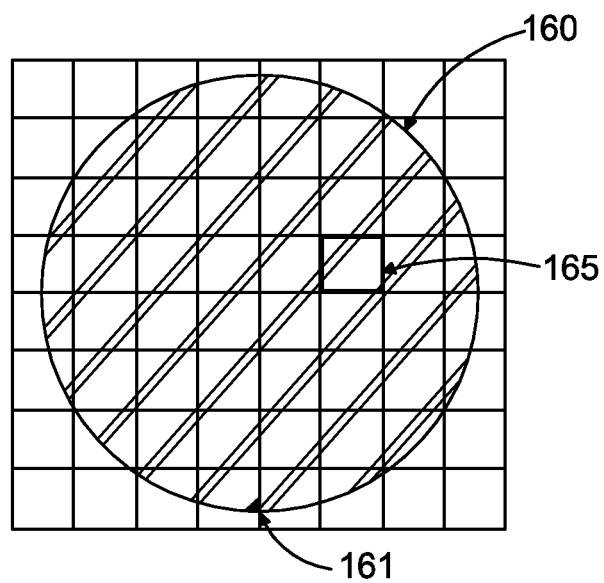
FIG. 1B shows a silicon substrate with a number of dies, in accordance with some embodiments.
Figure 1C:
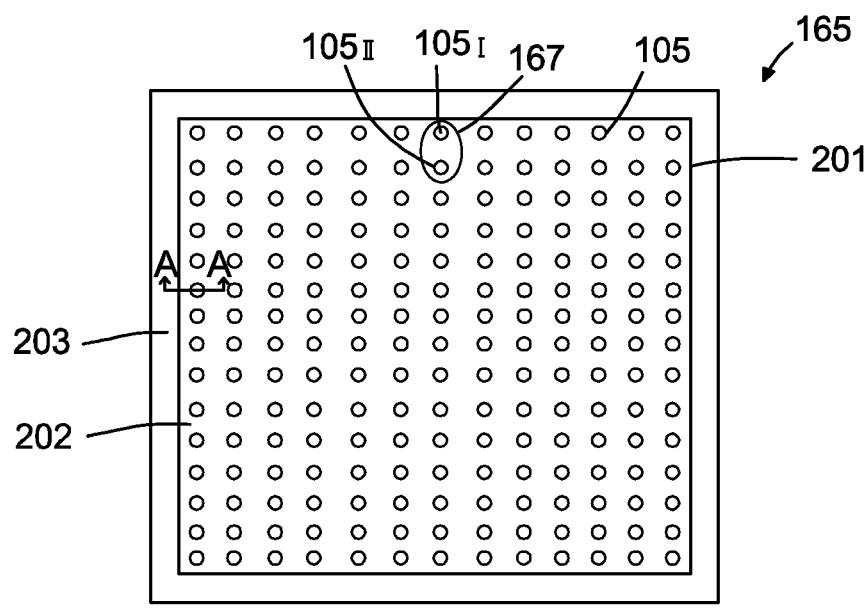
FIG. 1C shows a sawed die, in accordance with some embodiments.

As mentioned above, the markings are not placed on the flip-chip package 150 until the packaging process is or almost is completed. Prior to the placement of the markings, it could be difficult to determine the orientation of the IC chip 100. FIG. 1B shows a silicon substrate 160 with a number of dies 165, in accordance with some embodiments. The orientation of the dies 165 is identified by a wafer-level orientation mark 161, which can be a laser scribe, a small opening, or other types of markings at the wafer edge. After the wafer level processing is completed, dies 165 are sawed and separated from each other and from remaining pieces of substrate 160. Once dies 165 are sawed and separated from substrate 160, the only way to determine their orientation is by the patterns on dies 165. For users exposed to multiple products, determining orientation by patterns on die 165 could be difficult, confusing, and time-consuming. Further, for flip-chip technology, dies 165 could have already undergone the formation of bumps, such as bumps 105 of FIG. 1A, before dies 165 are sawed and separated from one another. The pattern on each die 165 is a pattern of bumps 105, as shown in FIG. 1C, in accordance with some embodiments. The bump patterns could be similar for different products, which makes the identification of the orientation of sawed dies 165 difficult.

Dies 165 on substrate 160 are usually electrically tested prior to being sawed. The electrical test results of dies 165 separate them in to different groups (or bins), which may include pass, fail, and different levels (or categories) of failures. The dies in the group of "pass" would be physically picked up by an apparatus from substrate 160 to undergo further packaging process. The dies in the group of "fail" are rejected and may be tossed away or be used for failure analysis. The dies in the groups of different levels of failures (or questionable dies) could be kept as low-grade products, electrically repaired, or further tested to confirm the results, or the questionable dies could be rejected. Sometimes perfectly good dies (or dies that are categorized as "pass" dies) could also be pulled off the processing line for analysis and/or testing. After the analysis and/or testing, the good dies can be returned to the product line to finish the packaging process and be sold as products.

Because some of the questionable dies are returned to the production line, the orientations of these dies could be difficult to determine as they no longer are on the substrate 160 and yet they have not undergone the marking process. The knowledge of the orientations of the dies that are to be rejoined with the production line is important to ensure correct product marking and correct placement of these dies on the package substrates, such as substrate 110 of FIG. 1A or a personal computer (PC) board. If the orientation of a sawed die is not correctly identified, the die could be misplaced in the flip-chip package and cause failure in the package or end product. Such mistakes could be very expensive. Therefore, there is a need to develop a mechanism that helps identifying the orientation of a sawed die.

As depicted in FIG. 1C, one way to mark the orientation of the dies is allow a particular region, such as region 167 on the die 165, to be free of bumps (i.e. bumps $105_I$ and/or $105_{II}$ in region 167 are designed out). The missing bumps in region 167 could be used as an orientation marking. However, restricting a region to be free of bumps could be too cumbersome for circuit design. It would be better for the orientation marking(s) not to place restrictions on circuit design.

FIG. 1C shows that bumps 105 and integrated circuits (ICs, not shown) of die 165 are enclosed within a seal ring 201, in accordance with some embodiments. A seal ring has been used in the industry to protect the ICs inside the seal ring from moisture degradation, ionic contamination, and stress from the sawing (or dicing) process. The example of seal ring in FIG. 1C has one single seal ring. In some embodiments, there could be more than one seal ring, such as two or more concentric seal rings. In addition, the exemplary corners of seal ring 201 shown in FIG. 1C are straight corners. Other shapes of seal ring corners, such as dented or rounded shapes, are also possible. More detailed description of exemplary seal ring structures can be found in U.S. Pat. No. 6,861,764, U.S. patent application Ser. No. 12/915,170, titled "Grounded Seal Ring Structure in Semiconductor Devices" and filed on Oct. 29, 2010, and U.S. patent application Ser. No. 12/938,272, titled "Multiple Seal Ring Structure" and filed on Nov. 2, 2010. The above mentioned patent and patent applications are incorporated herein by reference in their entireties.

Figure 1D:
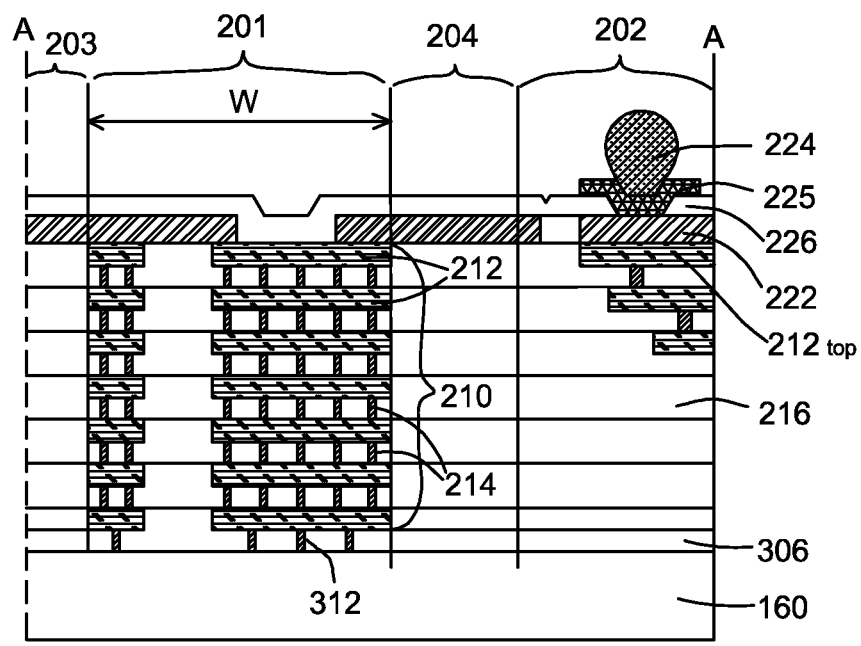
FIG. 1D shows a cross-sectional view of a portion of die in FIG. 1C cut along A-A line, in accordance with some embodiments.

FIG. 1D shows a cross-sectional view of a portion of die 165 cut along A-A line of FIG. 1C, in accordance with some embodiments. The semiconductor die 165 may include a semiconductor substrate 160, such as a silicon substrate, with a seal ring region 201 and assembly isolation region 204 surrounding a device region 202. The assembly isolation region 204 separates the device region 202 from the seal ring region 201. In some embodiments, the width of the assembly isolation region 204 is in a range from about 1 micron (μm) to about 10 microns (μm). Beyond the seal ring region 201 is a scribe line region 203.

In an embodiment, the seal ring region 201 is formed around the device region 202, and the seal ring region 201 is for forming a seal ring structure thereon and the device region 202 is for forming at least a transistor device (not shown) therein. The substrate 160 may alternatively include silicon germanium, gallium arsenic, or other suitable semiconductor materials. The substrate 160 may further include doped regions. The substrate 160 may also further include other features such as a buried layer, and/or an epitaxial layer. Furthermore, the substrate 160 may be a semiconductor on insulator such as silicon on insulator (SOI). In other embodiments, the semiconductor substrate 160 may include a doped epitaxial layer, a gradient semiconductor layer, and/or may further include a semiconductor layer overlying another semiconductor layer of a different type such as a silicon layer on a silicon germanium layer. In other examples, a compound semiconductor substrate may include a multilayer silicon structure or a silicon substrate may include a multilayer compound semiconductor structure. The circuit region may contain devices, such as NMOS devices (e.g., nFETs), PMOS devices (e.g., pFETs), etc. The semiconductor substrate 160 may further include underlying layers, devices, junctions, and other features (not shown) formed during prior process steps or which may be formed during subsequent process steps.

Die 165 may further include isolation structures (not shown), such as shallow trench isolation (STI) features, or local oxidation of silicon (LOCOS) features formed in the substrate 160 for isolating active regions from other regions of the substrate 160. Die 165 may undergo various processing to form devices (or device structures).

After the devices are formed, die 165 may further include an inter-level dielectric (ILD0) layer 306 deposited over substrate 160. In one example, the ILD0 layer 306 may be deposited by a high aspect ratio process (HARP) and/or a high density plasma (HDP) chemical vapor deposition (CVD) process. In one example, the ILD0 layer 306 is an oxide and can be doped with dopants, such as phosphorus. Gate structures (not shown) could be embedded in ILD0 layer 306 and transistor doped regions (not shown) could be formed in substrate 160. Contacts 312 may be formed within ILD0 layer 306. Contacts 312 are part of the interconnect structure and may electrically and physically couple active regions.

Seal ring structure 210 may be comprised of various metal layers 212 and via layers 214 disposed through dielectric layers 216. The various metal layers 212 and via layers 214 are part of the interconnect structure. In some embodiments, the width (W) of the seal ring region 201 is in a range from about 5 microns (μm) to about 30 microns (μm). The number of metal layers 212, via layers 214, and dielectric layers 216 may vary from product to product. In some embodiments, there could be 6, 7, or 8 layers of metal. However, the metal layers and corresponding via layers and dielectric layers could be more or less.

FIG. 1D shows an exemplary metal bump 224 in the device region 202. The metal bump 224 is placed over an under bump metallurgy (UBM) layer 225. The UBM layer 225 electrically connects with the various metal layers 212, via layers 214, contacts 312, and active device regions (not shown) through a re-distribution layer (RDL) 222, in accordance with some embodiments. A passivation layer 226 covers the RDL 222 and isolates the RDL 222 from portions of the UBM layer 225 that are not in contact with the RDL 222. The passivation layer 226 may be made of a polymer, such as polyimide. In some embodiments, there is more than one passivation layer and one of the passivation layers is made of a chemical vapor deposited (CVD) dielectric, such as silicon nitride and/or silicon oxide. The RDL 222 may extend across the assembly isolation region 204 into the seal ring region 201, in accordance with some embodiments.

RDL 222 may be comprised of a conductive material and a single layer, in accordance with some embodiments. In some other embodiments, RDL 222 may be comprised of various conductive materials and/or a plurality of conductive layers.

For example, RDL 222 may be comprised of aluminum, silver, lead, tin, copper, other metal(s), or alloys thereof. Metal bump 224 may be comprised of silver solder, lead tin, copper, or other materials. Metal bump 224 may also be comprised of various cross-sectional shapes, such as a circle, octagon, or a hexagon, etc. More detailed description of exemplary materials and manufacturing methods for metal bumps, such as metal bump 224, and the UBM layer, such as UBM layer 225, can be found in U.S. patent application Ser. No. 13/012,916, titled "Mechanisms for Resistivity Measurement of Bump Structures" and filed on Jan. 25, 2011.

Figure 1E:
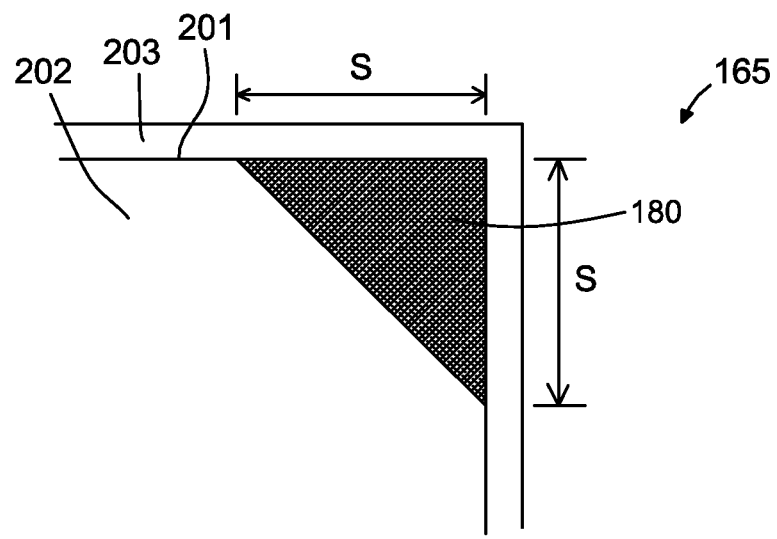
FIG. 1E shows a corner stress relief (CSR) region of the semiconductor die, in accordance with some embodiments.

Corners of semiconductor dies often suffer from high stress, which could lead to interfacial peeling at metal and/or dielectric layers. As a result, some semiconductor manufacturers specify that corner regions of semiconductor dies are to be free of devices, interconnect, and metal bumps (or designs) to prevent or reduce the impact of interfacial peeling. These corner regions that are free of designs are called corner stress relief (CSR) regions. FIG. 1E shows a CSR region 180 of the semiconductor die 165, in accordance with some embodiments. The CSR region 180 of FIG. 1E is shaped as a right isosceles triangle with a short length of "S". However, the CSR regions could be in other shapes. The CSR region 180 is enclosed by the seal ring 201, in accordance with some embodiments. In some embodiments, the length "S" is in a range from about 20 μm to about 200 μm. However, the CSR region 180 does not need to be in the shape of a right isosceles triangle. Other shapes are also possible. Because the CSR region 180 is free of devices, interconnect structures, and metal bumps, marking(s) can be placed in this region(s) to identify the orientation of die 165.

Figure 2A:
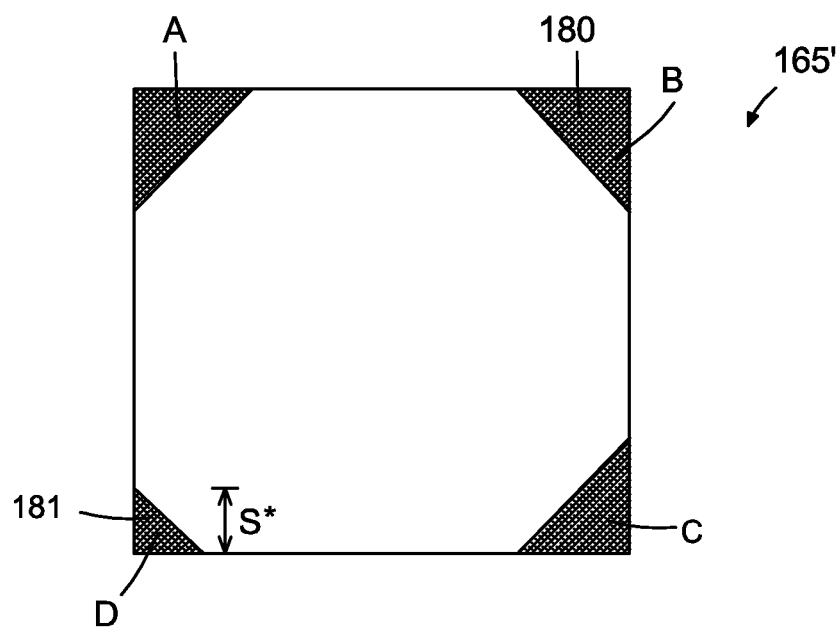
FIGS. 2A-2F show top views of a semiconductor die with various mechanisms of orientation markings, in accordance with some embodiments.

FIG. 2A shows a top view of a semiconductor die 165' with 4 corners, A, B, C, and D, in accordance with some embodiments. Corners A, B, and C all have CSR regions 180 covered with a metal layer, such as the RDL 222, or an interconnect metal layer near the top, such as metal layer 212$_{top}$ of FIG. 1D. A different number of corners may be available for dies with different shapes. RDL 222 is visible when viewing from the top of the die 165', because the passivation layer(s) 226 over the RDL 222 are transparent.

In contrast, the CSR region 180 of corner D of die 165' is only partially covered with the metal layer that covers the CSR regions 180 of corners A, B, and C. The metal-covered region 181 at corner D is significantly smaller than the completed covered CSR regions 180 of corners A, B, and C to be visibly noticeable with the help of a magnifying glass. For example, if CSR regions 180 of corners A, B, and C has a length "S" at about 70 μm. The length "S*" of region 181 at corner D may be in a range from about 1/10 (7 μm) to about 1/2 (35 μm) of the length "S" at the other 3 corners. By using a high power magnifying glass, such as with 40× magnifying power, a user, such as a technician or an operator, would be able to view the corner regions and identify that corner D with the smallest corner metal coverage is different from the other three corners. As long as the length S* at corner D is visibly smaller than the length S at the other corners, the markings at the corners can be used to tell the orientation of die 165'. In some embodiments, the metal coverage in corner D is equal to or less than about 1/3 area of one of the CSR region.

Figure 2B:
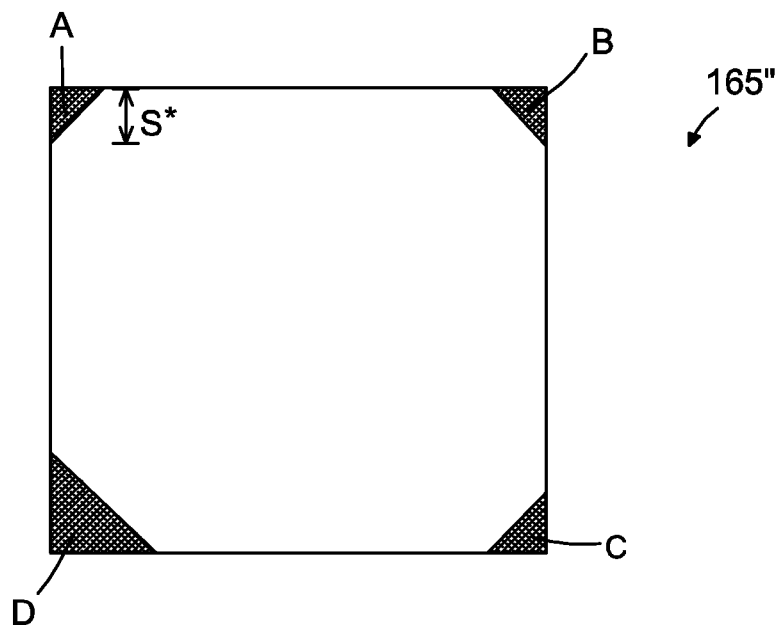

FIG. 2B shows a top view of a semiconductor die 165" with 4 corners, A, B, C, and D, in accordance with some embodiments. FIG. 2B shows that the metal coverage of CSR region at corner D is higher than corners A, B, and C. With one corner with metal coverage being visibly larger or smaller (as in FIG. 2A), a user would be able to identify the different corner. As a result, the orientation of the die 165' or 165" may be identified. The examples above use corner D as the different corner. However, other corners, such as corner A, B, or C, may be used as the different corner.

Figure 2C:
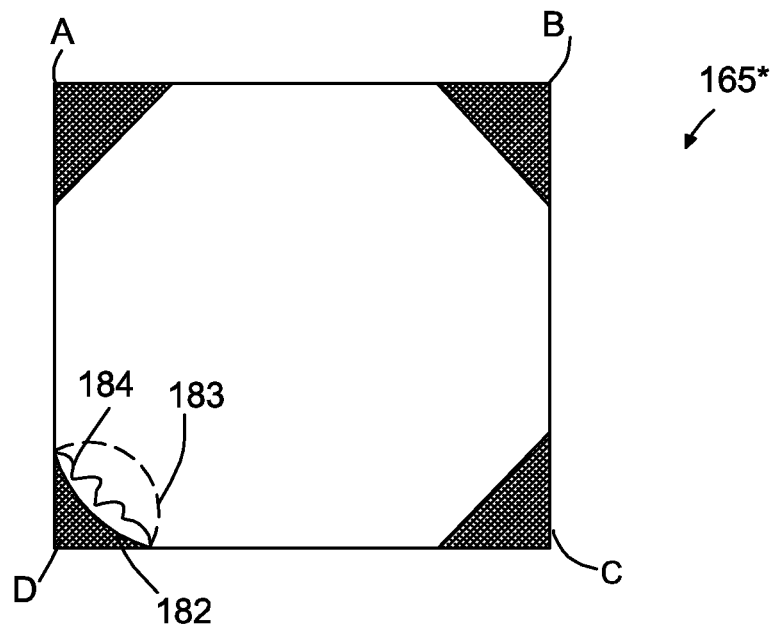
Figure 2D:
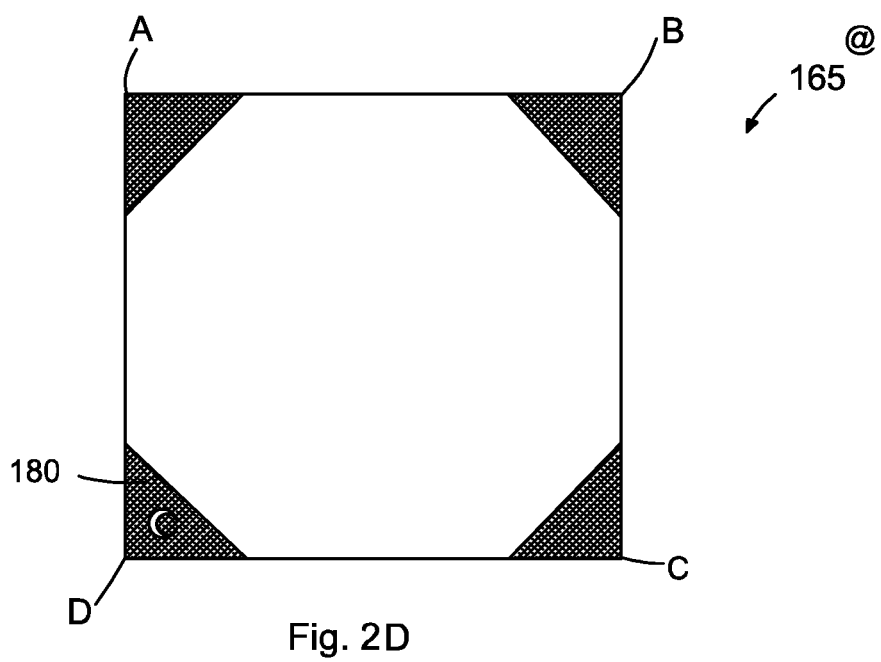
Figure 2E:
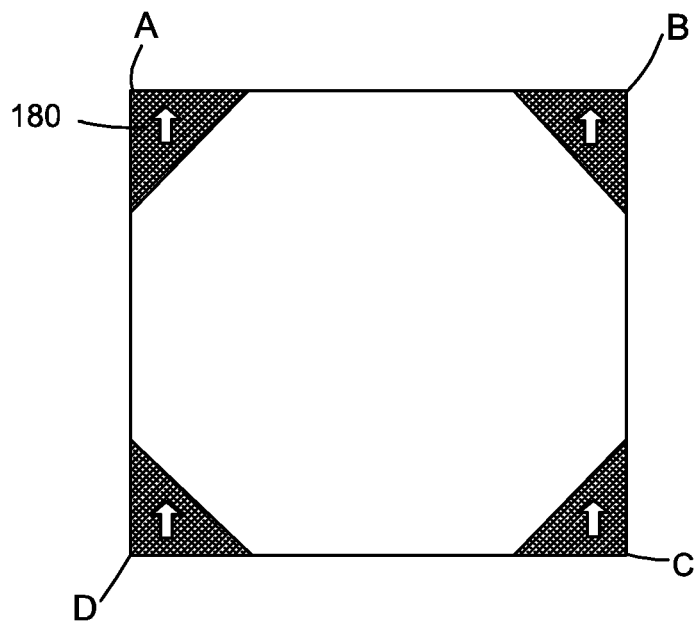
Figure 2F:
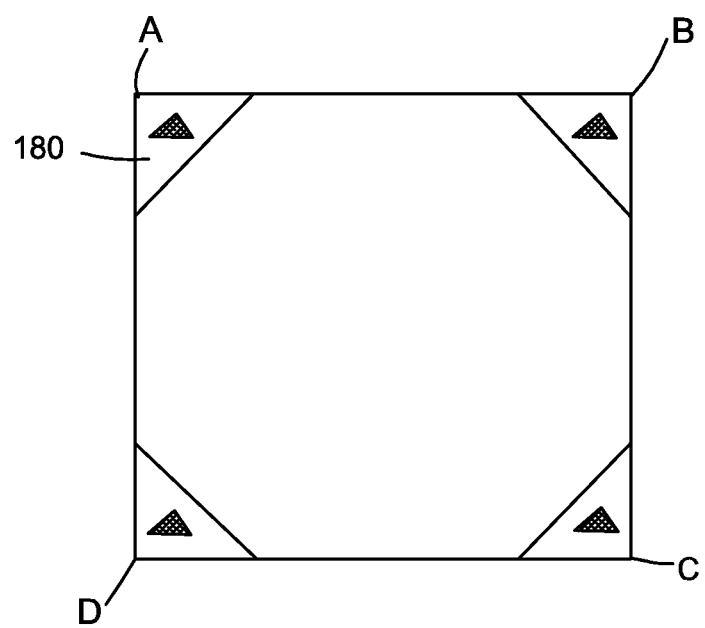

In addition, the corner markings do not have to be in the shape of the CSR regions. FIG. 2C shows a top view of a semiconductor die 165* with 4 corners, A, B, C, and D, in accordance with some embodiments. Corner D has a corner coverage pattern different from the other three corners. For example, corners A, B, and C have CSR regions 180 (triangle regions) all covered with a metal layer. The metal-covered region 181' at corner D could have a concave shape, bordered by curve 182, a convex shape, bordered by curve 183, or an irregular shape, bordered by a wiggly curve 184. The unique border at corner D could help differentiate corner D from the other three corners. In addition, corner D can have other patterns that help differentiate corner D from the other three corners. For example, corner D of substrate 165$^@$ may have one or more alphabetical symbols, such as a single alphabetical character "C", in one or more CSR regions 180, as shown in FIG. 2D in accordance with some embodiments. In the examples described above, the CSR regions are covered by metal. However, the CSR regions 180 can also be left blank and only a corner with a marking that is covered fully or partially marks the metal layer. In addition to placing one or more alphabetical symbols in one or more CSR regions, other symbols may also be used. For example, one or more numbers or one or more directional symbols, such as an arrow or a triangle, may be placed in one or more CSR regions. FIG. 2E shows a directional arrow is placed in each of the CSR regions, in accordance with some embodiments. FIG. 2F shows a (metal-filled) directional triangle is placed in the CSR regions, in accordance with some embodiments. The directional triangles in FIG. 2F are four identical isosceles with the long length on the bottom. Alternatively, the directional triangle may be placed in one, two, or three of the CSR regions. The symbol(s) in the corner(s) needs to large enough to be visible by a high power magnifier, such as a 40× magnifier. In some embodiments, each of the width and the length of the symbol(s) in one corner is in a range from about 20 μm to about 100 μm.

The embodiments described above provide mechanisms for identifying orientation of a sawed die. By making a metal pattern in the corner stress relief region in one corner of the die different from the other three corners, users can easily identify the orientation of the die. Because there is no device, interconnect, or bump in the CSR regions, the placement of the metal patterns in these regions has no impact on the circuit design.

In some embodiments, a structure for identifying the orientation of a sawed die is provided. The structure includes a corner of the saw die with a first pattern of a metal layer being different from a second pattern of the metal layer at the other three corners of the saw die. The first and second patterns are in corner stress relief (CSR) regions of the sawed die. No devices, interconnect structures, or bumps are placed in the CSR regions.

In some embodiments, a structure for identifying the orientation of a sawed die is provided. The structure includes a corner of the saw die with a first pattern of a metal in a corner stress relief (CSR) region of the sawed die. No devices, interconnect structures, or bumps are placed in the CSR region.

In yet some other embodiments, a structure for identifying the orientation of a sawed die is provided. The structure includes a corner of the saw die with a first pattern of a metal layer being different from a second pattern of the metal layer at the other three corners of the saw die. The first and second patterns are in corner stress relief (CSR) regions of the sawed die, and no devices, interconnect structures, or bumps are placed in the CSR regions. The CSR regions are right isosceles triangles, and each right isosceles triangle has a short length in a range from about 20 µm to about 100 µm.

Accordingly, the present disclosure provides mechanisms of marking the orientation of sawed dies. While the preceding description shows and describes one or more embodiments, it will be understood by those skilled in the art that various changes in form and detail may be made therein without departing from the spirit and scope of the present disclosure. Therefore, the claims should be interpreted in a broad manner, consistent with the present disclosure.

What is claimed is:

1. A structure for identifying the orientation of a sawed die, comprising:
    a corner of the sawed die with a first pattern of a metal layer being different from a second pattern of the metal layer at other corners of the sawed die, wherein the first and second patterns are in corner stress relief (CSR) regions of the sawed die, and wherein no active devices, interconnect structures, or bumps are placed in the CSR regions,
    wherein the corner with the first pattern differs from the other three corners in a visibly detectable way by using a high-power magnifier having a 40× magnifying capability.

2. The structure of claim 1, wherein the metal layer is a re-distribution layer (RDL) that enables connections of bumps to interconnect structures of devices.

3. The structure of claim 2, wherein the RDL is made of aluminum.

4. The structure of claim 1, wherein the metal layer is a top conductive layer of interconnect structures of devices, and wherein, the first pattern of the top conductive layer in the corner is viewable from above the sawed die.

5. The structure of claim 1, wherein the CSR regions are right isosceles triangles, and wherein each of the right isosceles triangles has a short length in a range from about 20 µm to about 200 µm.

6. The structure of claim 5, wherein the second pattern of the metal layer covers substantially the right isosceles triangles of the CSR regions at the other three corners, and wherein the first pattern of the metal layer covers substantially a right isosceles triangle having a short length equal to or less than about half of the short length of one of the right isosceles triangles of the CSR regions.

7. The structure of claim 5, wherein the first pattern of the metal layer covers substantially the one of the right isosceles triangles of the CSR regions at the corner, and wherein the second pattern of the metal layer covers substantially three right isosceles triangles each having a short length equal to or less than about half of the short length of the right isosceles triangles of the CSR regions.

8. The structure of claim 1, wherein the second pattern of the metal layer covers substantially the CSR regions at the other three corners, and wherein the first pattern of the metal layer of the corner covers substantially equal to or less than about ⅓ the area of one of the CSR regions at one of the other three corners.

9. The structure of claim 1, wherein the first pattern includes at least an alphabetical symbol, a number, or a directional symbol.

10. The structure of claim 9, wherein the first pattern including at least an alphabetical symbol, a number, or a directional symbol having a width in a range from about 20 µm to about 80 µm.

11. The structure of claim 1, wherein the CSR regions are enclosed by a seal ring structure, and wherein the seal ring structure includes multiple levels of interconnect layers protecting a device region from moisture degradation, ionic contamination, and stress from die sawing.

12. The structure of claim 11, wherein the CSR regions are disposed between the seal ring structure and the device region in the sawed die.

13. The structure of claim 1, wherein the first and the second patterns are covered by a transparent passivation layer.

14. A structure for identifying the orientation of a sawed die, comprising:
    a corner of the sawed die with a first pattern of a metal in a corner stress relief (CSR) region of the sawed die, wherein no active devices, interconnect structures, or bumps are placed in the CSR region; and
    at least two other corners of the sawed die with a second pattern of metal in a CSR region, wherein the second pattern is different from the first pattern.

15. The structure of claim 14, wherein the metal layer is a re-distribution layer (RDL) that enables connections of bumps to interconnect structures of devices or a top conductive layer of interconnect structures of devices, and wherein, the first pattern in the corner is viewable from above the sawed die with a magnifier.

16. The structure of claim 14, wherein the first pattern includes an alphabetical symbol, a number, or a directional symbol.

17. The structure of claim 14, wherein the CSR region is enclosed by a seal ring structure, and wherein the seal ring structure includes multiple levels of interconnect layers protecting a device region from moisture degradation, ionic contamination, and stress from die sawing.

18. The structure of claim 17, wherein the CSR region is disposed between the seal ring structure and the device region in the sawed die.

19. The structure of claim 14, wherein the first pattern includes an alphabetical symbol, a number, or a directional symbol that is visible from above the sawed die.

20. A structure for identifying the orientation of a sawed die, comprising:
    a corner of the sawed die with a first pattern of a metal layer being different from a second pattern of the metal layer at other corners of the sawed die, wherein the first and second patterns are in corner stress relief (CSR) regions of the sawed die, wherein no active devices, interconnect structures, or bumps are placed in the CSR regions, wherein the CSR regions are right isosceles triangles, and wherein each of the right isosceles triangles has a short length in a range from about 20 µm to about 100 µm.

21. The structure of claim 20, wherein each corner of the sawed die, other than the corner having the first pattern, has the second pattern of the metal layer.

* * * * *